United States Patent [19]

Herwig

[11] Patent Number: 5,221,894
[45] Date of Patent: Jun. 22, 1993

[54] WELD CURRENT SENSOR

[75] Inventor: Warren E. Herwig, Oshkosh, Wis.

[73] Assignee: Miller Electric Manufacturing Company, Appleton, Wis.

[21] Appl. No.: 844,209

[22] Filed: Mar. 2, 1992

[51] Int. Cl.⁵ ............................................. G01R 1/04
[52] U.S. Cl. .................... 324/117 R; 324/126; 324/133; 324/127
[58] Field of Search ............... 324/117 R, 127, 133, 324/126; 340/664; 361/143, 93; 335/236, 151

[56] References Cited

U.S. PATENT DOCUMENTS

| | | | |
|---|---|---|---|
| 3,602,771 | 8/1971 | Walstad | 361/31 |
| 3,711,749 | 1/1973 | Koblents et al. | 335/151 |
| 3,832,521 | 8/1974 | Niendorf | 335/151 |
| 3,866,197 | 2/1975 | Schweitzer, Jr. | 340/664 |
| 3,991,366 | 11/1976 | Schweitzer, Jr. | 340/664 |
| 4,115,764 | 9/1978 | Yamaguchi et al. | 324/133 |
| 4,378,525 | 5/1983 | Burdick | 324/127 |
| 4,791,361 | 12/1988 | Beinhoff et al. | 324/126 |
| 4,808,916 | 2/1989 | Smith-Vaniz | 324/110 |
| 4,841,235 | 6/1989 | Hastings et al. | 324/117 |
| 4,943,791 | 7/1990 | Holce et al. | 335/151 |
| 4,947,108 | 8/1990 | Gudel | 324/127 |
| 4,998,060 | 3/1991 | Yeh | 324/117 R |
| 5,055,771 | 10/1971 | Gamble et al. | 324/133 |

Primary Examiner—Vinh Nguyen
Attorney, Agent, or Firm—Donald Cayen

[57] ABSTRACT

A weld current switch includes a channel-shaped core, a shunt, and a magnetic reed switch. The magnetic reed switch and shunt are placed across the core poles. An electrical conductor carrying high current passes through the core. Upon deenergization of the electrical current, a residual magnetism remains in the core. The residual magnetism is normally high enough to prevent the magnetic reed switch from opening. However, the shunt directs sufficient magnetic flux from the switch such that the switch senses a much lower level of magnetic flux than if the shunt were not present. As a result, the switch opens, even with the high residual flux in the core. The increased reliability of the switch upon decreasing current at electrical conductor deenergization enables the weld current switch to use a higher sensitivity switch than was formerly possible. The higher sensitivity switch reduces the level of magnetic flux at which the reed switch will close on increasing current upon energization of the electrical conductor.

16 Claims, 2 Drawing Sheets

WELD CURRENT SENSOR

BACKGROUND OF THE INVENTION

1. Field of the Invention

This invention pertains to electrical controls, and more particularly to apparatus that utilizes magnetic fields to control electrical circuits.

2. Description of the Prior Art

It has long been known that a magnetic field exists around an electrical conductor, and that the strength of the magnetic field is proportional to the amount of current in the conductor. A portion of the magnetic flux can be captured in a magnetic core that surrounds the conductor. The core can be continuous, or it can be discontinuous such that an air gap exists between two ends of the core.

The magnetic flux surrounding a current carrying conductor is frequently used to control electrical circuits. For that purpose, a magnetic reed switch or other electrical device may be placed in the air gap of a discontinuous core. When the current in the conductor, and thus the amount of magnetic flux in the core and air gap, reaches a predetermined value, the flux acts to magnetize the switch and cause it to close. The switch may be incorporated into any of a great number of circuits for controlling components based on the state of the switch.

An exemplary application of a magnetic field operated switch is weld current relay Model No. 007 036 manufactured by Miller Electric Manufacturing Company of Appleton, Wis. FIGS. 1 and 2 show the relevant components of this prior weld current relay, which is indicated by reference numeral 1. The weld current relay 1 is made with a core 3 of magnetically permeable material, such as soft iron. The core 3 has spaced apart and overlapping ends 5. The spaced apart ends 5 form an air gap between them. The ends 5 are tapered, as shown at reference numerals 7. A tube 9 of non-magnetic material, such as copper, is secured to the core in the air gap between the two core ends. Inside the tube 9 is a magnetic reed switch 11. The magnetic reed switch 11 is composed of a glass bulb 13 and a pair of contacts 15 and 17 embedded in the wall of the glass bulb, as is known in the art. The contacts 15 and 17 are connected to two wires 23 and 25 that lead to a control device typically represented by block 27. The control device 27, in turn, controls various components, typically represented by block 29, of a welding system.

An electrical cable 31 passes through the core 3. When there is no current in the conductor 31, there is no magnetic flux in the core or in the magnetic reed switch 11, and the switch contacts 15 and 17 are open. When current passes through the conductor 31, magnetic flux is induced within the core 3. The flux passes between the core ends or poles 5, where it is concentrated by the tapers 7. When the flux reaches a predetermined level, it causes the contacts 15 and 17 to close. The closed contacts activate an appropriate portion of the control device 27 to control the components 29. For example, the control 27 may control such welding system components as valves that release protective gases around a welding arc and mechanisms that feed welding wires, such that gas flows or weld wire is fed in response to the existence of weld current.

Equally important as the closing of the contacts 15 and 17 of the weld current relay 1 upon start up of current in the conductor 31 is the opening of the contacts upon shut off of the current. Opening of the magnetic reed switch 11 can control, for example, closure of valves that direct protective gases around a welding arc and cessation of feeding of welding wires. Because of the hysteresis of the magnetic material of the core 3, the level of the magnetic flux that will allow the contacts 15 and 17 to open on current shut off is always less than the level of the magnetic flux that will close the contacts upon current startup, as is shown in FIG. 3a. In FIG. 3a, point Ca represents the magnetic flux required to close a typical magnetic reed switch upon start up of current in a conductor, and point Oa represents the level of the flux at which the switch will reopen upon shut-off of current in the conductor.

The prior weld current relay 1 was designed to detect magnetic flux point Ca corresponding to current in the conductor 31 upon welding start up of between about 50 and 70 amps and to operate with a maximum current of approximately 500 amps. Upon shut off of the current, the hysteresis of the magnetically permeable core 3 causes the contacts 15 and 17 of the magnetic reed switch 11 to reopen at point Oa, which was at an acceptably low level of flux. Any residual magnetism in the core was not enough to prevent the magnetic reed switch contacts from properly opening when the current was zero amps.

The prior weld current relay 1 works very well, and a great number of them have been in service for several years. However, recent advances in welding technology have pointed out some limitations to the prior weld current relay. For example, the development of welding robots has led to the requirement for detecting an initial current that is substantially less than the formerly acceptable level of approximately 50 to 70 amps. That requirement is quite difficult to meet, as can be explained with reference to FIG. 4. FIG. 4 shows pertinent portions of a representative weld current relay 32 having a core 33 with first and second poles 35 and 37, respectively. A typical magnetic reed switch 39 is shown in the air gap 41 between the core poles 35 and 37. The switch has contacts 43 and 45, which are open in the absence of a sufficiently strong magnetic flux within the air gap 41. The contacts 43 and 45 are enclosed within a glass bulb 47. Contact 43 passes through the bulb 47 in the form of a magnetic wire 49 that is bent at 180 degrees such that the end 50 of the wire is proximate the bulb. Contact 45 passes through the bulb in the form of a straight wire 51.

In order for magnetic flux to close the contacts 43 and 45 of the magnetic reed switch 39, the flux must be strong enough to pass through three air gaps: the air gap 53 between the core first pole 35 and the wire 49; the air gap 55 between the two contacts 43 and 45; and the air qap 57 between the wire 51 and the core second pole 37. As mentioned, modern requirements dictate that the maximum detect point pull-in of a magnetic reed switch on increasing current in a conductor be as low as possible. For reasons to be explained shortly, it is not possible for the prior weld current relay 1 to employ a more sensitive switch in order to obtain a suitably low maximum detect point.

Another aspect of present welding practice is the use of high welding currents of 1,000 amps and more. After such a high current is turned off, the high levels of residual magnetism in the core 3 of the weld current relay 1 (FIGS. 1 and 2) may be great enough to keep the magnetic reed switch contacts 43 and 45 closed. That situation is illustrated in FIG. 3b. FIG. 3b shows that the opening point Ob of the switch contacts on decreasing current is not reached when the current falls to zero; it actually takes a negative current to decrease the residual flux sufficiently to open the switch. Consequently, the weld current relay occasionally misdetects the residual magnetism around a deenergized electrical conductor 31 following shut-off of high welding current as being the much lower level of magnetism associated with the initial welding current that provides the maximum detect point to close the switch on increasing current. As a result, the various components 29 of the welding equipment that are controlled by the welding current may continue to operate as though welding is occurring, even though in actuality welding has ceased.

The use of a higher sensitivity magnetic reed switch to close at a low level of increasing current would aggravate the problem of the switch remaining closed upon current shutdown. In other words, a higher sensitivity switch would sense a suitable maximum detect point pull-in on increasing current, but that switch would rarely, if ever, sense a suitable minimum un-detect point for drop out on decreasing current.

Another problem with prior weld current relays concerns the configuration of the magnetic reed switch wires, such as wires 49 and 51 of the typical switch 39 of FIG. 4, relative to the core ends 35 and 37. Looking at FIG. 5, a weld current relay 32' is shown in which an alternate way is used to bend the wires 49' and 51' of the magnetic reed switch 39'. The glass bulb 47' is rotated about axis 64' relative to the glass bulb 47 of the weld current relay 32 of FIG. 4, and the wire 49' of the switch 39' is therefore bent in a different configuration. The result is that the weld current relay 32' has different operating characteristics than the weld current relay 32, because the lines of magnetic flux 66 must follow different air gaps and paths between the core ends 35' and 37' compared with the core ends 35 and 37 of the weld current relay 32. This leads to inconsistent reed switch operation from one weld current relay to another.

To further aggravate the inconsistent operation of prior weld current relays, the angular displacement of the magnetic reed switch in the supporting tube 9 (FIG. 1) about its longitudinal axis, such as axis 64 of switch 32 and axis 64' of switch 32', is important. Thus, switch angular displacement introduces another variable into the performance characteristics of the weld current relay.

The wires of the magnetic reed switches of prior weld sensor relays are bent at random, and the switches are installed with random angular orientation about their longitudinal centerlines. Consequently, the performance of the prior weld sensor relays are quite inconsistent. Such inconsistent operations were rarely troublesome with prior welding equipment, but they are intolerable with modern welding robots and similar high technology equipment.

SUMMARY OF THE INVENTION

In accordance with the present invention, a weld current sensor is provided that is capable of more accurate and repeatable control of current dependent mechanisms than was previously possible. This is accomplished by apparatus that manages the magnetism of a magnetic core that partially surrounds a current carrying conductor.

The magnetic core is generally C shaped or channel-shaped. It has longitudinally spaced ends and middle and side legs of sufficient length to enable the conductor to pass easily through the core. The side legs terminate in respective free edges that extend longitudinally between the core ends. The free edges of the core side legs act as poles of the core. The core may be made from any conventional magnetically permeable material.

A magnetic reed switch is placed in the air gap between the free edges of the two side legs of the core. The magnetic reed switch is incorporated into an electrical circuit that controls auxiliary welding equipment, so that the state of the switch determines the performance of the equipment.

In general, it is desirable that the magnetic reed switch be as sensitive as possible, so that it closes when it is exposed to a relatively low level of magnetic flux. That is, it is desirable that the detect point of switch pull-in on increasing current be as low as possible. Further, for proper operation of the system, it is essential that the auxiliary equipment controlled by the weld current switch perform differently while welding is occurring than after welding has ceased. Consequently, the weld current switch must drop out on decreasing current at or above a minimum un-detect point. However, with higher welding current, the core retains some residual magnetism after the current shutdown. Ordinarily in that situation, the high sensitivity of the magnetic reed switch, which was required to assure pull in on increasing current at a maximum detect point, becomes a detriment. That is because the residual flux between the core poles tends to retain the switch in the closed state even though there is no current in the conductor. As a result, the switch un-detect point on decreasing current tends to fall below the required minimum and the switch remains closed in despite the absence of conductor weld current.

To solve the problems associated with residual magnetism due to high welding currents and residual flux, a magnetic shunt is placed in parallel with the magnetic reed switch across the poles of the core. The shunt need not extend for the full length of the core between the core longitudinal ends. The shunt may but need not be in contact with the free edges of the core side legs. The shunt cooperates with the core to form a path for magnetic flux surrounding the electrical conductor. The shunt is designed to have a much greater reluctance to magnetic flux than the core, but the shunt reluctance is nevertheless less than the reluctance of the air gap between the core side legs.

Upon energization of the electrical conductor, a portion of the resulting magnetic flux surrounding the conductor is captured in the core, and the free edges of the core side legs become magnetic poles. At low but increasing levels of current, the flux passes through the shunt. As the current in the conductor and the resulting flux increases, the shunt quickly saturates. The excess flux then passes through the air gap between the two core poles, and some of the flux passes through the magnetic reed switch. At a maximum detect point on increasing current, the flux is sufficient to close the switch contacts, thereby actuating circuitry for controlling auxiliary equipment. Any flux greater than that required to cause the switch to close passes directly between the two core poles.

Upon de-energization of the current in the conductor, the magnetic flux diminishes. The magnetic shunt path in the weld current sensor of the present invention enables any residual flux to pass through the shunt between the two core poles, thereby directing the residual flux away from the magnetic reed switch. The result is that the un detect point of the switch at which it will drop out on decreasing current is maintained above a minimum value even though there is a level of residual magnetism in the core and air gap that would be sufficient to keep the switch closed absent the shunt. The weld current sensor of the present invention can therefore be used in high current applications and still assure a minimum un-detect point drop out on decreasing current.

Further in accordance with the present invention, the magnetic reed switch is designed with a single configuration and orientation relative to the core poles. Specifically, the magnetic wires of the reed switch are not bent. In addition, the magnetic reed switch is not sensitive to angular displacement about its longitudinal axis. The result is that the weld current sensor has a high switch point repeatability such that it is suitable for use with high weld currents and modern auxiliary welding equipment.

Other advantages, benefits, and features of the invention will become apparent to those skilled in the art upon reading the detailed description of the invention.

DETAILED DESCRIPTION OF THE INVENTION

Although the disclosure hereof is detailed and exact to enable those skilled in the art to practice the invention, the physical embodiments herein disclosed merely exemplify the invention, which may be embodied in other specific structure. The scope of the invention is defined in the claims appended hereto.

Figure 6:
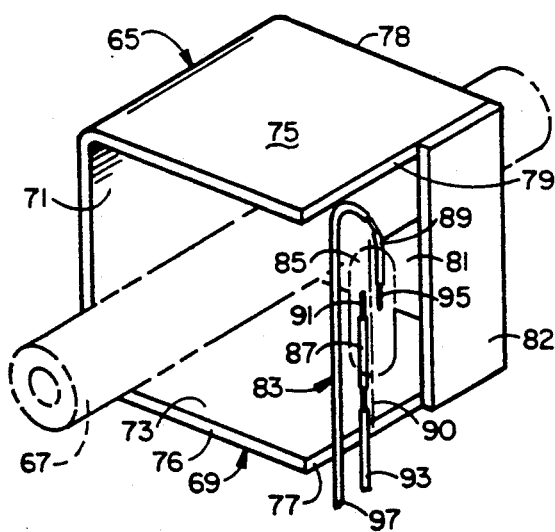
FIG. 6 is a perspective view of the essential components of the weld current sensor of the present invention.

Referring to FIG. 6, a weld current sensor 65 is illustrated that includes the present invention. The weld current switch 65 is particularly useful for managing the magnetism produced by welding current in an electrical conductor 67. However, it will be understood that the invention is not limited to welding applications.

In its simplest form, the weld current sensor 65 is comprised of a core 69 that is made of any magnetically permeable material, such as soft iron. The core 69 is channel shaped, having a middle leg 71, two side legs 73 and 75, and longitudinally spaced ends 76 and 78. The side legs 73 and 75 have respective free edges 77 and 79, between which is an air gap 81. The side leg free edges 77 and 79 are poles of the core. The size of the channel defined by the core middle leg 71 and the side legs 73 and 75 is adequate to enable the conductor 67 to pass without difficulty.

In accordance with the present invention, a shunt 82 spans the air gap 81 between the core poles 77 and 79 for at least a portion of the distance between the core longitudinal ends 76 and 78. In the weld current sensor 65, the shunt 82 is in contact with and is permanently fastened to the core poles. However, in some applications it may be desirable to space the shunt 82 a short distance from one or both of the core leg free edges 77 or 79. By spacing the shunt from the core, different operating characteristics of the weld current sensor are possible to enable it to suit specific requirements.

Also spanning the air gap 81 is a magnetic reed switch 83. The magnetic reed switch 83 has an elongated glass bulb 85 and a pair of magnetic wires 87 and 89. The magnetic wire 87 passes through one end of the glass bulb 85, and that wire 87 terminates inside the glass bulb in a contact 91. The end of the wire 87 outside of the glass bulb is connected to a lead 93. The magnetic wire 89 passes through the glass bulb opposite the wire 87, and the wire 89 has a contact 95 inside the glass bulb. The free end of the wire 89 outside the glass bulb is connected to a lead 97. The leads 93 and 97 are incorporated into any suitable circuit that enables the weld current sensor 65 to control various welding components, not illustrated in the drawings but well known in the art.

Figure 1:
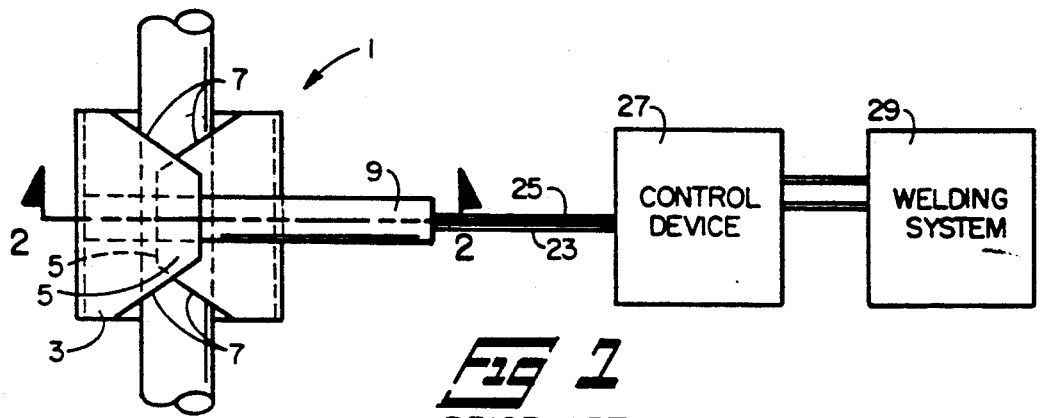
FIG. 1 is a top view of a typical prior weld current relay.
Figure 2:
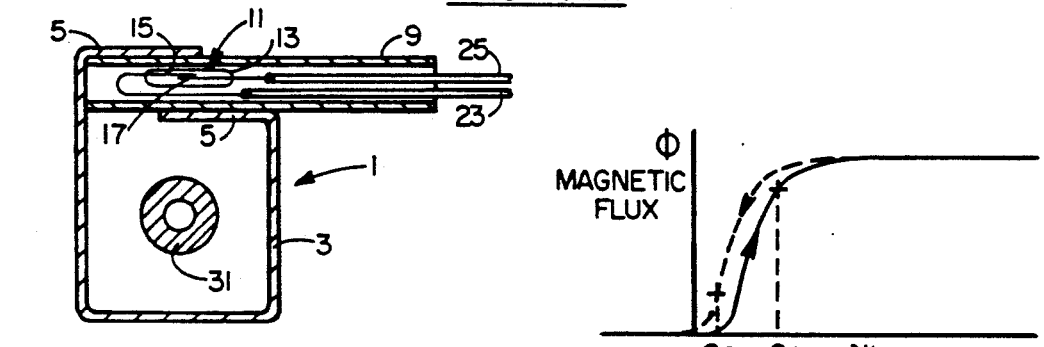
FIG. 2 is a cross-sectional view taken along lines 2—2 of FIG. 1.
Figure 3A:
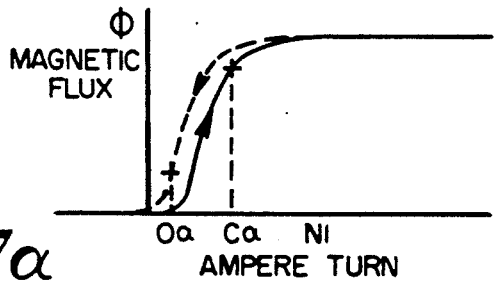
FIGS. 3a-3c are curves showing the operational characteristics of various reed relay configurations.
Figure 3B:
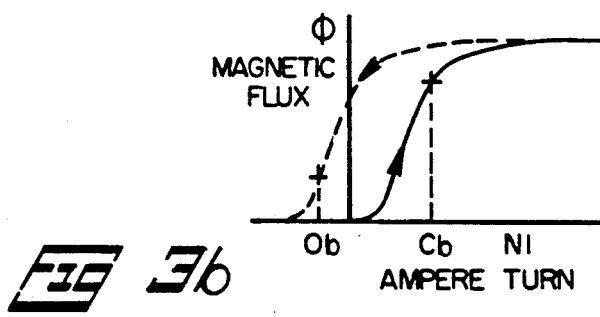

Looking also at FIG. 3c, the operation of the magnetic shunt 82 (FIG. 6) will be explained. The purpose of the shunt is to solve the sensitivity problem associated with the magnetic reed switch 83 remaining closed after a high weld current in the conductor 67 has been turned off. As was discussed previously with respect to FIG. 3b, when the weld current ceases, the magnetic flux within the core 69 decreases greatly. However, because of the residual magnetism within the core, some flux does remain. The magnetic shunt 82 provides a low reluctance path in parallel with the magnetic reed switch 83 through which the residual flux can pass. Consequently, for the same amount of residual magnetism in the core 69, substantially less residual flux passes through the switch 83 than in prior weld current relays without the shunt. The shunt 82 is carefully designed to direct sufficient residual flux from the reed switch 83 to assure that the switch contacts 91 and 95 open at a higher level of total residual flux in the core and with more repeatability than was possible with prior weld current relays.

A potentially detrimental side effect of the shunt 82 has to do with the maximum detect point pull in on increasing current. As shown in FIG. 3c, immediately upon the application of the weld current, the corresponding magnetic flux surrounding the conductor 67 and captured in the core 69 is quite small. That small amount of flux ordinarily would pass through the magnetic reed switch 83. However, at low conductor current the magnetic flux more easily passes through the magnetic shunt path 82 than through the higher reluctance air gap 81 and magnetic reed switch path.

As conductor current increases, the magnetic core flux increases proportionately. The shunt 82 is designed to saturate with a small amount of flux, so any flux greater than that required to saturate the shunt passes through the magnetic reed switch 83. The level of increasing flux eventually becomes sufficient to close the switch. At that point, the total flux through the core equals the flux in the magnetic shunt path plus the flux in the magnetic reed switch path. It is thus seen that the shunt requires that there be a higher level of total magnetic flux in the core to close the magnetic reed switch than would be required without the shunt. Accordingly, the design of the weld current sensor 65 is a compromise between increased repeatability with regard to the minimum un detect drop-out on decreasing current on one hand, and a lower maximum detect point pull in on increasing current on the other hand. Fortunately, the improved repeatability regarding the minimum un detect point introduced into the weld current sensor 65 of the present invention by the shunt 82 enables a more sensitive magnetic reed switch 83 to be used than in prior designs. In fact, with careful design, it is possible to obtain a maximum detect point pull in on increasing current that is lower than was previously possible with prior designs.

Figure 3C:
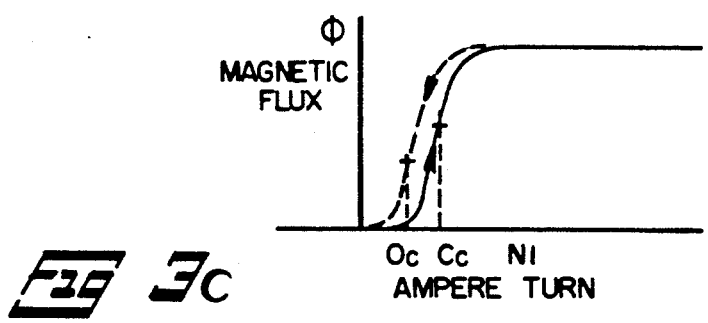

As shown in FIG. 3c, a further increase in the current in conductor 67 to its operating level has no effect on either the shunt or the magnetic reed switch. Flux greater than that required to close the switch merely passes directly between the two core poles.

Figure 4:
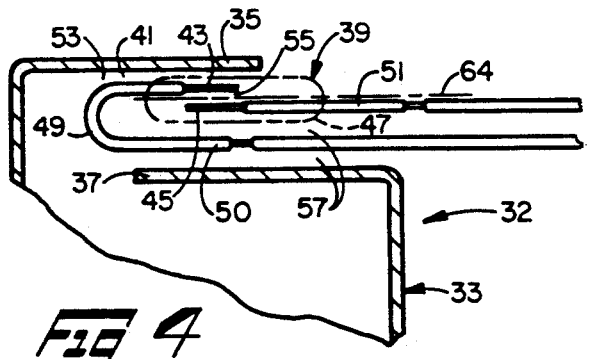
FIG. 4 is an enlarged cross sectional view of relevant portions of a typical prior weld current relay showing various paths taken by magnetic flux during operation.
Figure 5:
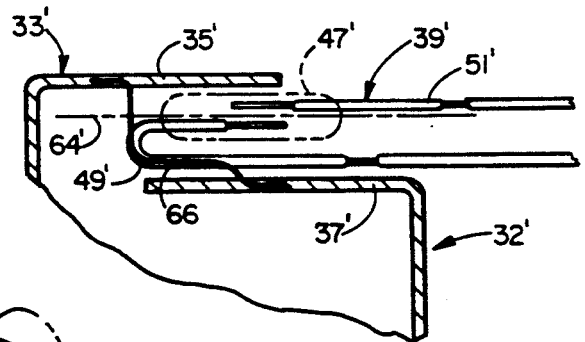
FIG. 5 is a view similar to FIG. 4, but showing an alternate configuration for the magnetic reed switch of the prior weld current relay.

To solve the problems of inconsistent operation due to random bending and angular displacement of the prior magnetic wires 49, 49', 51, and 51' in FIGS. 4 and 5, the equivalents of those wires in the weld current sensor 65 of the present invention are not bent. For example, the magnetic wires 87 and 89 of FIG. 6 are not bent. This configuration has the greatest sensitivity to magnetic flux between the core poles 77 and 79.

Figure 7:
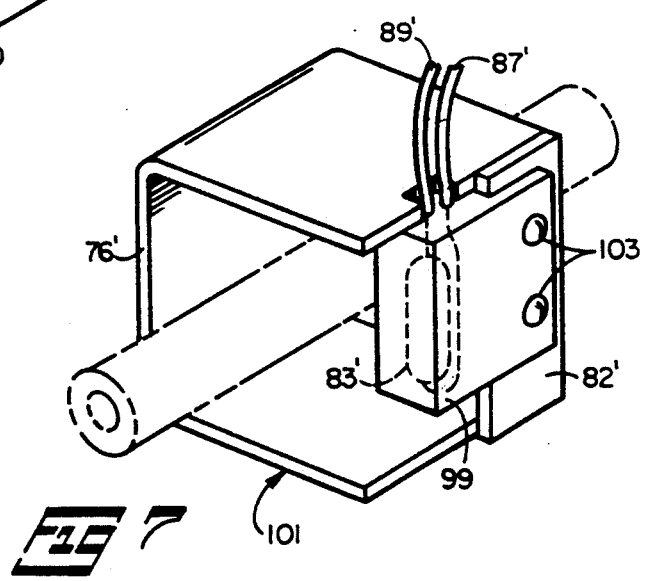
FIG. 7 is a perspective view of a commercially acceptable version of the present invention.

FIG. 7 shows a magnetic reed switch 83' with wires 87' and 89' encapsulated in a plastic case 99. The plastic case 99 may be fastened to the shunt 82' by fasteners 103 to create an easily manufactured and reliable weld current sensor 101.

As a typical example, a shunt in the form of a thin plate 0.018 inches thick and 0.50 inches wide was made of a low carbon iron material. The detect point or pull-in point for the magnetic reed switch on increasing direct current is 43 amps maximum, with a nominal value of 32 amps, and a minimum value of 20 amps. The corresponding values for alternating current are 34, 29, and 25 amps. Those values represent a significant improvement over the corresponding values of between approximately 50 and 70 amps obtained with prior weld sensor relays. Similarly, the minimum un detect point drop-out of the weld current switch 65 with the shunt as described on decreasing direct current is 30 amps maximum, 23 amps nominal, and 18 amps minimum. With alternating current, the corresponding values are 33, 27, and 24 amps, respectively.

Thus, it is apparent that there has been provided, in accordance with the invention, a weld current sensor that fully satisfies the aims and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A weld current sensor comprising:
   a. a core partially surrounding an electrical conductor that periodically conducts large electrical currents, the core having opposed free edges that define an air gap therebetween, the core capturing a portion of the magnetic flux produced when current is in the conductor, the core retaining a residual flux after the conductor has stopped conducting current;
   b. magnetic detection means extending across the air gap between the core free edges for defining a first path for flux therebetween and for operating from a first state to a second state upon exposure to a first selected amount of magnetic flux and for operating from the second state to the first state upon exposure to a second selected amount of flux less than the first selected amount of flux and less than the residual flux; and
   c. a shunt extending across the air gap, the shunt defining a shunt path for residual flux that directs a predetermined amount of residual flux in the core away from the magnetic detection means to cause the magnetic detection means to be exposed to the second selected amount of flux and thereby cause operation of the magnetic detection means from the second state to the first state thereof despite the retention of residual flux in the core greater than the second selected amount of flux,
   so that the magnetic detection means operates from the second state to the first state thereof when the conductor has stopped conducting current despite the retention of residual flux in the core after the conductor has stopped conducting current.

2. The weld current sensor of claim 1 wherein
   a. the core is generally channel-shaped having opposed longitudinal ends; and
   b. the shunt extends part way between the core longitudinal ends.

3. The weld current sensor of claim 2 wherein:
   a. the magnetic detection means is encapsulated in non-magnetic case; and
   b. the non-magnetic case is attached in facing contact to the shunt.

4. The weld current sensor of claim 1 wherein the shunt path has predetermined lesser reluctance to the residual flux than the reluctance of the magnetic detection means path to thereby enable the shunt to divert a predetermined amount of residual flux away from the magnetic detection means.

5. The weld current sensor of claim 1 wherein the shunt is in direct facing contact with both of the free edges of the core.

6. The weld current sensor of claim 1 wherein the shunt is in direct facing contact with at least one free edge of the core.

7. Apparatus for managing the residual magnetic flux surrounding an electrical conductor conducting decreasing current comprising:
   a. core means having poles for providing a source of the residual magnetic flux;
   b. switch means located between the poles of the core means for operating in response to sensing a predetermined level of magnetic flux less than the residual magnetic flux; and
   c. shunt means located between the poles of the core means for directing a selected amount of residual magnetic flux away from the switch means to reduce the magnetic flux sensed by the switch means to the predetermined level of magnetic flux and thereby enable the switch means to operate with residual magnetic flux present in the core means greater than the predetermined level of magnetic flux.

8. The apparatus of claim 7 wherein:

a. the core means comprises a generally channel-shaped core having spaced apart free edges, the free edges being the core poles, the core having a selected longitudinal length; and b. the shunt means comprises a magnetic plate having opposed ends and extending between the core poles, at least one shunt end being in direct facing contact with a core pole.

9. The apparatus of claim 8 wherein the shunt extends between the core poles for a distance less than the longitudinal length of the core.

10. The apparatus of claim 8 wherein both shunt ends are in contact with the core poles.

11. A weld current sensor for controlling selected auxiliary equipment in response to increasing and decreasing weld current in an electrical conductor comprising:

a. a magnetic core partially surrounding the conductor and having opposed poles, the core capturing a portion of the magnetic flux that surrounds the conductor;

b. a magnetic reed switch extending between the core poles, the magnetic reed switch operating in response to sensing a first predetermined level of magnetic flux on increasing flux corresponding with increasing current in the conductor, the switch resetting in response to sensing a second predetermined level of magnetic flux on decreasing flux corresponding with decreasing current in the conductor; and c. a shunt in direct facing contact with and extending between the core poles, the shunt directing a selected amount of magnetic flux between the core poles away from the magnetic reed switch to thereby cause the magnetic reed switch to sense a lower level of flux than the level of the magnetic flux in the core, so that the magnetic reed switch operates and resets upon sensing the first and second, respectively, predetermined levels of flux that are less than the corresponding levels of flux in the core.

12. The weld current sensor of claim 11 wherein:

a. a residual flux remains in the core after the weld current has decreased to zero; and b. the first and second predetermined levels of magnetic flux are less than the residual flux, so that the magnetic reed switch operates and resets upon sensing the first and second, respectively, predetermined levels of magnetic flux that are less than the residual flux in the core.

13. The weld current sensor of claim 12 wherein the second predetermined level of magnetic flux corresponds to a predetermined minimum un-detect point of the magnetic reed switch on decreasing current in the electrical conductor.

14. A method of managing the magnetism produced by an electrical conductor comprising the steps of:

a. partially surrounding the electrical conductor with a magnetic core having opposed poles;

b. providing a magnetic shunt that extends between the core poles;

c. installing a magnetic reed switch adjacent to the shunt and extending generally between the core poles;

d. energizing the electrical conductor with a predetermined amount of current to produce a corresponding first level of magnetic flux in the core, shunt, and magnetic reed switch sufficient to operate the magnetic reed switch;

e. deenergizing the electrical current and maintaining a residual flux in the core;

f. directing at least a portion of the residual flux through the shunt and bypassing the magnetic reed switch to reduce the flux sensed by the switch to a second level less than the level of the residual flux in the core; and g. resetting the magnetic reed switch in response to sensing the second level of flux by the switch.

15. The method of claim 14 wherein the step of installing a magnetic reed switch comprieses the steps of:

a. encapsulating the magnetic reed switch in a case of non-magnetic material; and b. attaching the case of non-magnetic material in facing contact to the shunt.

16. The method of claim 14 wherein the step of providing a magnetic shunt comprises the step of fastening a magnetic shunt to both poles of the core to completely surround the conductor.

* * * * *